(12) United States Patent
Saliba

(10) Patent No.: US 11,218,175 B2
(45) Date of Patent: ***Jan. 4, 2022

(54) CLOUD-BASED SOLID STATE DEVICE (SSD) WITH DYNAMICALLY VARIABLE ERROR CORRECTING CODE (ECC) SYSTEM

(71) Applicant: Quantum Corporation, San Jose, CA (US)

(72) Inventor: George Saliba, Boulder, CO (US)

(73) Assignee: Quantum Corporation, San Jose, CA (US)

(\*) Notice: Subject to any disclaimer, the term of this patent is extended or adjusted under 35 U.S.C. 154(b) by 61 days.

This patent is subject to a terminal disclaimer.

(21) Appl. No.: 16/549,433

(22) Filed: Aug. 23, 2019

(65) Prior Publication Data

US 2020/0091940 A1 Mar. 19, 2020

Related U.S. Application Data

(63) Continuation of application No. 14/722,905, filed on May 27, 2015, now Pat. No. 10,439,650.

(51) Int. Cl.
| | |
|---|---|
| *H03M 13/35* | (2006.01) |
| *G06F 11/10* | (2006.01) |
| *G11C 29/02* | (2006.01) |
| *H03M 13/37* | (2006.01) |
| *G11C 29/52* | (2006.01) |
| *H03M 13/00* | (2006.01) |
| *G11C 29/04* | (2006.01) |

(52) U.S. Cl.
CPC ....... *H03M 13/353* (2013.01); *G06F 11/1044* (2013.01); *G06F 11/1048* (2013.01); *G11C 29/028* (2013.01); *H03M 13/3761* (2013.01); *G06F 11/1068* (2013.01); *G06F 2212/7207* (2013.01); *G11C 29/52* (2013.01); *G11C 2029/0411* (2013.01); *H03M 13/6356* (2013.01)

(58) Field of Classification Search
CPC .......... H03M 13/353; H03M 13/3761; H03M 13/6356; G06F 11/1048; G06F 11/1044; G06F 2212/7207; G06F 11/1068; G11C 29/028; G11C 2029/0411; G11C 29/52
USPC ....................................................... 714/764
See application file for complete search history.

(56) References Cited

U.S. PATENT DOCUMENTS 8,560,926 B2 10/2013 Yeh
8,788,894 B2 7/2014 Kang
(Continued)

*Primary Examiner* — James C Kerveros

(57) ABSTRACT

Example apparatus and methods control an error correcting code (ECC) approach for data stored on a solid state device (SSD). The control may be based on a property (e.g., reliability, error state, speed) of an SSD, or on an attribute of the data to be stored. Approaches including a hybrid rateless Reed-Solomon ECC approach or a fountain code ECC approach may be selected. Example apparatus and methods may store padded portions of an ECC at different locations in an SSD. Example apparatus and methods may dynamically generate performance test data about the SSD, and dynamically control the ECC approach based on the performance test data. Different types or numbers of ECC may be produced, stored, and provided for different data sets stored at different SSDs or at different physical locations within an SSD. The SSD may be local, or may be part of a cloud-based storage system.

20 Claims, 8 Drawing Sheets

(56) References Cited

U.S. PATENT DOCUMENTS

| | | | |
|---|---|---|---|
| 8,806,108 B2 * | 8/2014 | Suzuki | G06F 3/0616 |
| | | | 711/103 |
| 8,856,431 B2 | 10/2014 | Chen et al. | |
| 8,898,541 B2 | 11/2014 | Okubo et al. | |
| 9,336,081 B2 | 5/2016 | Liang | |
| 2012/0317334 A1 | 12/2012 | Suzuki et al. | |
| 2014/0136927 A1 * | 5/2014 | Li | G06F 11/1068 |
| | | | 714/768 |

* cited by examiner

CLOUD-BASED SOLID STATE DEVICE (SSD) WITH DYNAMICALLY VARIABLE ERROR CORRECTING CODE (ECC) SYSTEM

RELATED APPLICATIONS

This application is a continuation of U.S. patent application Ser. No. 14/722,905, entitled "CLOUD-BASED SOLID STATE DEVICE (SSD) WITH DYNAMICALLY VARIABLE ERROR CORRECTING CODE (ECC) SYSTEM", filed on May 27, 2015, which is hereby incorporated by reference in its entirety.

BACKGROUND

Users want to conveniently and reliably store and communicate electronic data. Data that is stored or communicated may be error-free or may experience errors. More and more data is stored by users in offsite locations. In many instances, the offsite location is a cloud-based storage system. Conventionally, a cloud-based storage system may include a plurality of hard disk drives, tape drives, or combinations of hard disk drives and tape drives. Therefore, users have developed different techniques to protect data stored to cloud-based hard disk drives and tape drives. For example, data may be protected against storage media failures or other loss by storing extra copies in additional locations or by storing additional redundant information from which data may be reconstructed. One type of redundancy-based protection involves using error correcting codes (ECC). Error correcting codes create additional redundant data to produce code symbols that protect against 'erasures' where data portions that are lost or corrupted can be reconstructed from the surviving data. Adding redundancy introduces computing overhead to produce the codes and also introduces overhead for additional storage capacity or transmission bandwidth, which in turn adds cost. The overhead added by error correcting code processing tends to increase as the protection provided increases.

Cloud-based storage systems may employ flash memory organized in solid state drives (SSD). SSDs are typically faster than hard disk drives and tape, but slower than random access memory (RAM). As the cost of SSD technology decreases, more and more SSDs are being added to cloud-based storage systems, both as a supplement to hard disk drives, and as a replacement for hard disk drives. For example, a cloud-based storage system may include a combination of hard disk drives for short-term storage, tape drives for long-term storage, RAM to store indexes and buffers, and SSDs to act as a bridge between the RAM and hard disk. In other examples, the primary storage medium for a cloud-based storage system may be an SSD or a plurality of SSDs. SSDs may be comprised of NAND type flash memory.

Solid-state devices that include flash memory operate under different principles than disk drives or tape drives. SSDs are typically organized using blocks of pages. A page may be a smaller plurality of bytes. For example, a page may be 512 bytes or 16 k bytes. A block may contain a number of pages. For example, a block may include 8, 16, 32, 128, or other numbers of pages. Unlike hard disks, which can read and write from individual cells, SSDs support only page reads and writes. When writing data, SSDs support sequential writes within a block, unlike the more random write access available to disks. Similarly, SSDs only support block erases, unlike hard disks which may erase individual cells.

Consequently, SSDs fail differently than disk drives or tape drives. Disk drives and tape drives may experience mechanical failures among their large number of moving parts which may render the entire drive useless. SSDs may fail, for example, when individual flash memory locations reach a threshold number of writes, or when writes to one location in the SSD corrupt other, physically close locations. The SSD failure may not render the entire device useless. Conventional cloud-based storage systems may employ different fixed approaches that are optimized to protect data stored to hard disk drives and tape drives. These approaches may include ECCs tailored for use with data stored to hard disks or tape drives. However, conventional systems using these fixed approaches may not be optimal for use with SSDs. In a NAND based SSD, a write failure typically affects the entire page because an SSD can only erase, write or read at the page level. Contrast this with a hard disk, which, if a portion within a sector fails, the remaining ECC bytes read from the sector may be used to correct the defective bytes. Other sectors on the disk are not affected. Therefore, a data protection approach tailored to a hard disk may be sub-optimal for an SSD.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
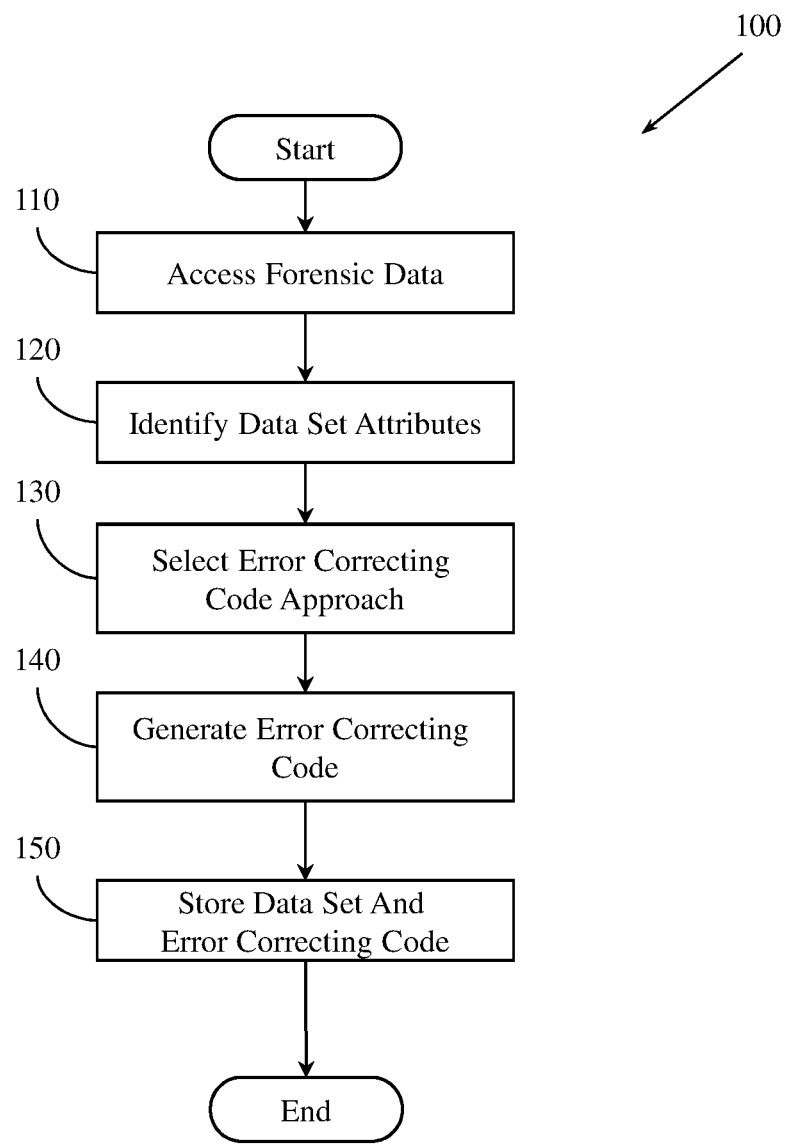
FIG. 1 illustrates an example method associated with dynamically selecting an ECC approach for a SSD.

Conventional data storage systems may employ error correction approaches tailored to protect data stored on hard disk drives or tape drives in the data storage system. In a hard disk drive, mechanical failures among the large number of moving parts may render the drive partially or completely inoperable. While the disk itself might not be damaged, the effect is to make all the data stored on the disk inaccessible. Alternately, instead of a complete failure, sectors of the disk may become physically damaged. Some data may be recoverable, while the data stored in the damaged sectors may be irretrievably corrupted or lost. Tapes or tape drives may have similar mechanical failures, in which some or all of the data becomes inaccessible or corrupted. Conventional error correction approaches that have been applied to data storage systems based around hard disk and tape drive technology may have been based on the assumption that when a data storage device (e.g., disk) failed, it failed completely. Thus, disk based systems are often paired with fixed redundancy policies that employ a fixed comprehensive amount of ECC that is distributed at the time the data was distributed to the storage system. This assumption may not be the best assumption in some scenarios. For example, in a cloud storage system employing solid state devices, a device may not fail completely, but may "fail" intermittently by not being available. SSDs employed in a cloud storage system may also exhibit predictable failure and performance degradation patterns. Thus, example apparatus and methods may account for different types of failures than the conventional complete failure of a disk drive.

Solid state devices operate and fail differently than hard disk drives and tape drives. SSDs typically employ flash memory instead of moving mechanical parts. SSDs thus store and erase data differently than disk or tape. SSDs are organized using blocks of pages. A page may be a smaller plurality of bytes. For example, a page may be 512 bytes, 4 k bytes, 16 k bytes, or some other size. A block may contain a number of pages. For example, a block may include 8, 16, 32, 128, or other numbers of pages. Unlike hard disks, which can read and write from individual cells, SSDs only support page reads and writes. When writing data, flash memory SSDs support sequential writes within a block, unlike the more random write access available to disks. Similarly, SSDs only support block erases, unlike hard disks which may erase individual cells. For example, while a disk may be able to write 1 bit at a time, an SSD with page size of 512 bytes would only be able to write a complete page of 512 bytes. Similarly, while a disk may be able to erase a 16 byte chunk of data that it wrote, the SSD may only be able to erase the entire block containing the page to which the data was written.

In exchange for this trade-off in performance, SSDs typically have faster read and write times than disk. While SSDs typically are faster and more expensive than disk, they are also typically slower and less expensive than RAM. Thus, data storage systems may employ SSDs as bridges between slower disk and tape media and faster RAM. As the price of SSDs further decreases, the primary storage media in conventional data storage systems more frequently becomes SSDs. Thus, in some data storage systems, the primary storage media comprises flash-based SSDs. A consequence of SSDs writing and erasing data differently than disk and tape is that SSDs fail differently, and with different consequences, than disk or tape.

In a NAND based SSD, if one cell in a page fails, then the entire page is effectively lost because an SSD can only read at the page level. Contrast this with a hard disk, which, if one sector fails, other sectors may still be accessible. Therefore, a data protection approach tailored to a hard disk may be sub-optimal for a SSD. Since SSDs can only read at the page level, if the data protection approach is one conventionally used for disk storage, the data protection approach may be sub-optimal for an SSD based device. For example, an error correcting approach optimized for a hard disk system may store ECCs associated with a data set to various locations on a hard drive. If applied to a SSD based device, those hard disk optimized ECCs may all be written to one page. Thus, even if just one cell of the page of the SSD fails, the ECCs written to the rest of the page will be useless in recovering the data, since they will not be accessible.

Example methods and apparatus reduce the chance of data loss in a SSD by forcing multiple page writes by controlling how data or how ECCs are written to the SSD. Example methods and apparatus dynamically change how and when ECCs are created. Example methods and apparatus adaptively select an ECC approach for use with an SSD by maintaining local user-side statistics about the data stores to which data or ECCs are to be distributed. User-side statistics may include forensic data about a particular SSD, a group of SSDs, or about a cloud-based storage system that employs SSDs. The amount and type of ECCs that are stored to any particular SSD may be adapted by example methods and apparatus based on user-side statistics about the data stores. Example methods and apparatus may conduct dynamic performance testing of SSDs to update the forensic data relating to any particular SSD. Example methods and apparatus may also dynamically adapt the ECC approach based on the updated forensic data.

By forcing the SSD to write ECCs to multiple pages, example methods and apparatus mitigate the chance that a failure of any single cell within a page will render the stored data irretrievable. Since SSDs support only page reads and writes, the failure of a memory cell in a page can result in the entire page being irretrievable. If an entire page is lost, the distributed ECCs written to multiple different pages will reduce the cost that would have been incurred for losing the entire page.

Example methods and apparatus dynamically select an ECC approach. Dynamically selecting the ECC approach may be based on an analysis of forensic data about the SSD, or it may be based on an attribute of the data set to be stored. SSDs may fail in different ways. For example, NAND flash memory bits have a finite number of writes before the bit fails. SSD controllers may employ wear-levelling algorithms to evenly distribute writes to the different memory bits, and may maintain data about the number of writes to individual bits. Example methods and apparatus may take into consideration the number of writes to individual bits in the SSD, and select an ECC approach appropriate for the wear level and endurance of the particular SSD. Other forensic data about the SSD maybe be accessed and monitored. For example, writes to one bit in the SSD may "leak" over to adjacent bits, corrupting the data in the adjacent bit in what is known as "program disturb". Example apparatus and methods may monitor program disturbs in the SSD, and select an ECC approach optimized for this type of failure. For example, if the forensic data indicated that one bit or page was indicating more program disturbs than other bits or pages, example methods and apparatus may control distribution of data and ECCs to non-adjacent pages. Distributing data and ECCs to non-adjacent pages mitigates the risk of a program disturb corrupting the data or ECCs. By reducing the risk that the ECC will have to be de-coded to restore corrupt data, example methods and apparatus produce a tangible, real-world result by reducing the use of computing resources.

One ECC approach employed by example methods and apparatus is to employ a hybrid rateless Reed-Solomon code approach. Hybrid rateless Reed-Solomon codes are described in U.S. patent application Ser. No. 14/722,809 which is incorporated herein by reference. Dynamically changing how and when the ECCs are created is facilitated by the hybrid rateless Reed-Solomon codes.

Example methods and apparatus may update forensic data about the SSD by conducting performance testing of the SSD. The SSD may be given a task to perform. For example, the SSD may be controlled to write a test data set to a set of pages. The task may be timed, the error rate of the operation may be monitored, and the ECC approach may be adjusted based on the results of the test. More generally, the level of redundancy may be matched to the performance of the SSD with regard to different tasks and to the properties of the data set to be stored. With knowledge of the operating parameters of the SSD, the performance test may be tailored to the particular SSD, further improving the performance and reliability of the storage system.

FIG. 1 illustrates an example method 100 associated with dynamically selecting an ECC approach for a SSD. Method 100 includes, at 110, accessing electronic forensic data about a cloud storage system. In one embodiment, the cloud storage system is a solid state device (SSD). In one embodiment, the SSD is a NAND flash memory device. The electronic forensic data about the cloud storage system may include a return rate data, a random access time data, a read latency time data, a data transfer rate data, a read performance data, a wear levelling data, an access frequency data, a firmware bug data, a program disturb data, a page size data, or a flash memory type data. In other embodiments, other types of forensic data may be accessed. The electronic forensic data may be maintained on a user or sender side, separately from the cloud based SSD. The electronic forensic data may be stored in RAM, or in other storage media, including hard disk drives, CD-ROM, tape, and flash memory. Method 100 may control the computer to access the electronic forensic data by reading the electronic forensic data from RAM or other storage media. The electronic forensic data may be held in a data structure, including a list, an array, a tree, an XML file, and so on.

Method 100 also includes, at 120, identifying a data set attribute about the data set to be stored to the SSD. In one embodiment, the data set may be a message to be sent by a sender to be stored in a cloud storage system. In one embodiment, the data set comprises sub-blocks. In this example, the data set attribute is related to an order in which the sub-blocks are accessed, a sub-block reference count, a sub-block access frequency, a sub-block access group relationship, a sub-block accessing entity identity, a sub-block importance, or an indexing parameter. For example, a first sub-block may be associated with a first sub-block accessing entity identity, while a second sub-block may be associated with a second entity identity. In other embodiments, other data set attributes may be identified. The data set attribute may be derived from statistical data about the data set, or the data set attribute may be assigned by a user.

Method 100 also includes, at 130, selecting an error correcting approach based, at least in part, on an analysis performed by the computer of the electronic forensic data and the data set attribute. In one embodiment, method 100 may control the computer at 130 to assign a weight to values associated with the electronic forensic data and the attribute. For example, method 100 may track firmware bug data for an SSD, and may select one ECC approach when a threshold number of firmware bugs are detected for the SSD, and may select a different ECC approach if a threshold number of firmware bugs are not detected for the SSD. Method 100 may also, at 130, analyze the attribute. In one example, method 100 may select one ECC approach if a particular sub-block accessing entity identity is identified, and may select a different ECC approach if a different sub-block accessing identity is identified. For example, if a sub-block is associated with a time-sensitive, mission critical application, a faster and stronger ECC approach may be selected, while if a sub-block is associated with a monthly backup application, a slower ECC approach may be selected. Selection of the ECC approach may be based on analysis of combinations of electronic forensic data and data set attribute. For example, a first ECC approach may be selected if an SSD exhibits a particular wear levelling data and a sub-block in the data set exhibits a threshold access frequency, while a second ECC approach may be selected if a different wear levelling data is detected and the threshold access frequency is not met. Selecting the ECC approach may be based on other combinations of electronic forensic data and the attribute. Selecting the ECC approach based, at least in part, on an analysis performed by the computer of the electronic forensic data, and the attribute, improves on conventional methods because the ECC approach may be optimized for the current characteristics of the particular SSD to which the data set is being stored. Since different SSDs may degrade at different rates, in different ways, and in different locations, dynamically adapting the ECC approach for the particular SSD in use reduces the risk of data loss compared to conventional systems and methods.

Different embodiments may select from among different ECC approaches. For example, one ECC approach may select different error correcting codes depending on the result of the analysis. One ECC approach may store portions of the data set or ECCs to different physical locations in the SSD, or to different SSDs. Another ECC approach may control the computer to store multiple copies of the ECC to different SSDs, or to split the ECC into portions and store the portions to different locations in the SSD based, at least in part, on the forensic data and the data set attribute. Different ECC approaches may use different types of error correcting codes. Other ECC approaches may be defined or employed by different embodiments.

Method 100 also includes, at 140, generating one or more ECC associated with the data set based, at least in part on the ECC approach. In one embodiment, if a first ECC approach is selected, only one set of ECCs may be generated for the data set. If a second ECC approach is selected, multiple sets of ECCs may be generated for the data set. In one embodiment, the one or more ECCs are fountain codes. In another embodiment, the one or more ECCs are hybrid rateless Reed-Solomon codes. A hybrid rateless Reed-Solomon code approach improves on conventional error correction code approaches because when a hybrid rateless Reed-Solomon code is employed, additional rateless ECC symbols may be generated and stored on demand rather than computed as a complete set before the data is transmitted. The additional rateless ECC symbols may be generated using the same generator matrix that was used to generate the original rateless erasure codes. The original rateless ECC may not need to be deleted or overwritten. A hybrid rateless Reed-Solomon approach combines the speed and flexibility of rateless code approaches (e.g., fountain codes) with the efficiency of rated Reed-Solomon codes to produce a hybrid error correcting code (HECC) that is suitable for a dynamically variable ECC system that selectively determines the amount or type of ECC to produce for a given data set to be stored to a particular SSD.

Method 100 also includes, at 150, controlling the cloud data storage system to store a portion of the data set and a portion of the one or more ECC. The portion of the data set or the portion of the one or more ECC are selected based, at least in part, on the ECC approach. In one embodiment, a first portion of the one or more ECC may be selected to be stored in a first block of the SSD, while a second portion of the one or more ECC may be selected to be stored in a second, non-adjacent block of the SSD. The portion of the data set may be stored in yet another different block of the SSD. Storing the portion of the ECC and the portion of the data set in different blocks of the SSD reduces the chance of data loss caused by corruption of any one block or page of the SSD, and therefore reduces future use of computing resources.

Figure 2:
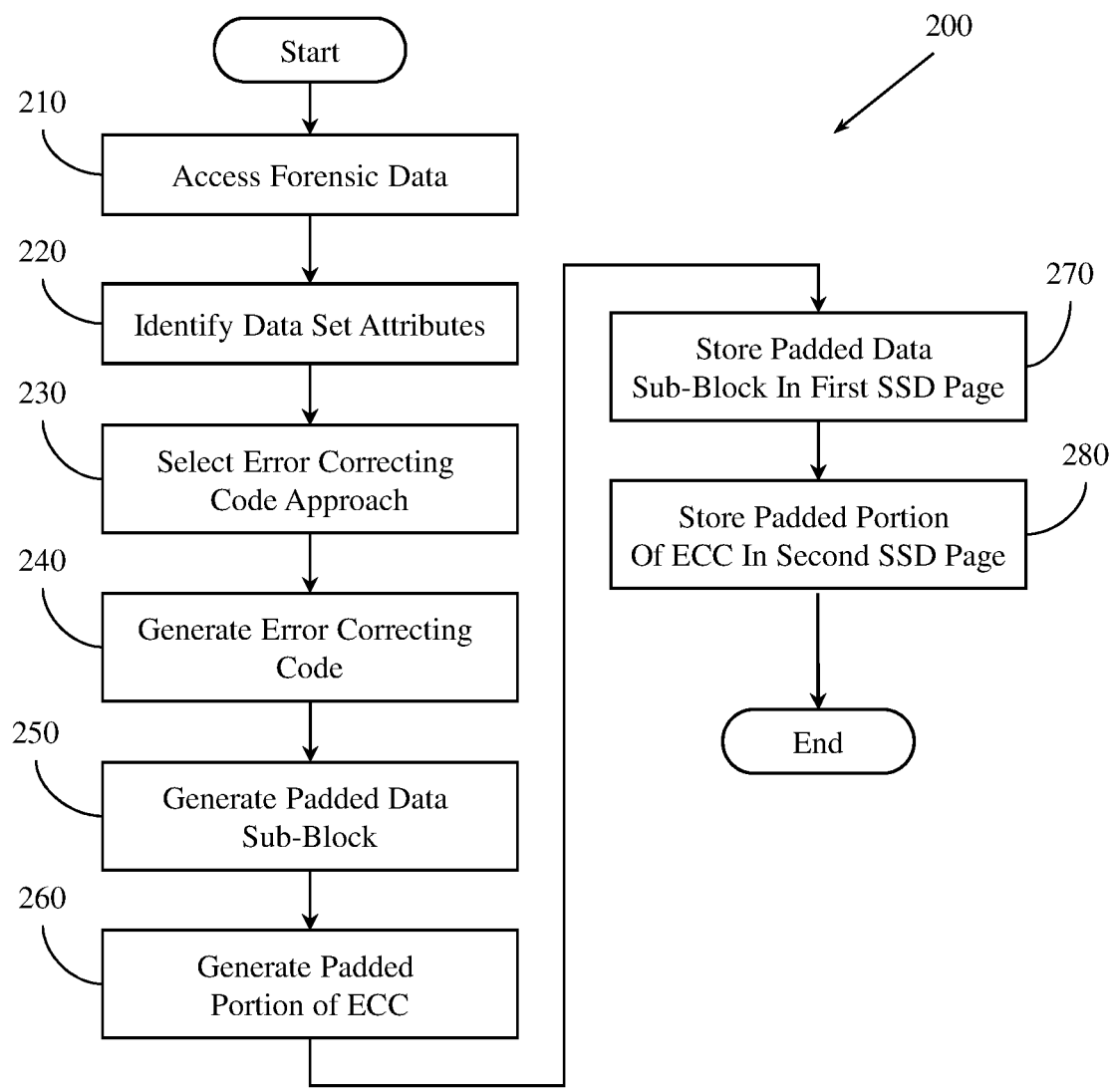
FIG. 2 illustrates an example method associated with dynamically selecting an ECC approach for a SSD.
Figure 3:
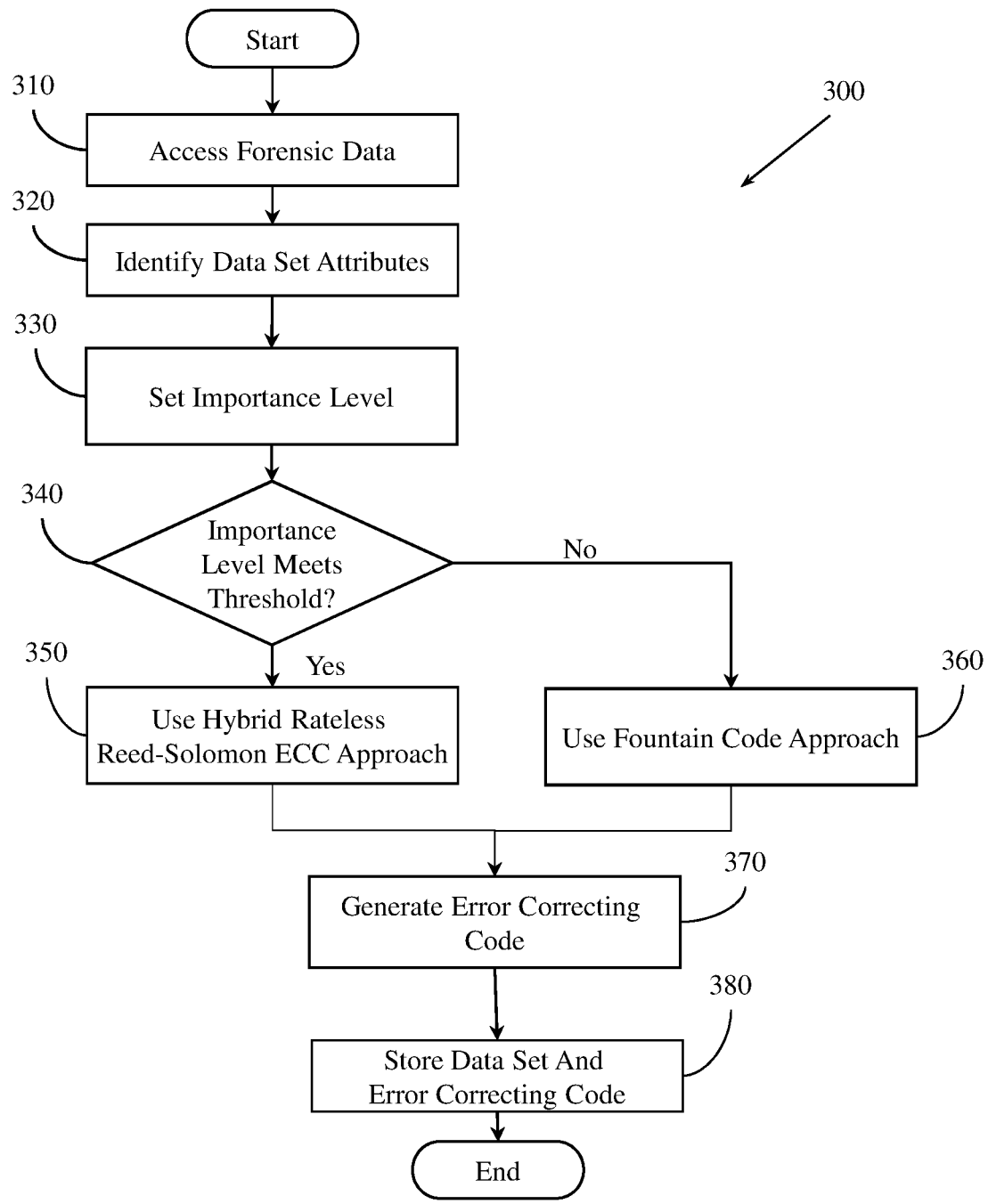
FIG. 3 illustrates an example method associated with dynamically selecting an ECC approach for a SSD.

FIG. 2 illustrates an example method 200 associated with dynamically selecting an ECC approach for a SSD. Method 200 is similar to method 100, but includes additional steps to control the cloud data storage system to store a portion of the data set and a portion of the one or more ECCs. Method 200 includes, at 250, generating a padded sub-block of the portion of the data set. In one embodiment, the padded sub-block is the same size as a page size of the SSD. For example, if the page size for a particular SSD was 8 k bytes, and if a sub-block of a portion of the data set was only 3 k bytes, method 200 would control the computer to pad the sub-block with 5 k bytes of redundant data to make the padded sub-block equal the size of the SSD page. By padding the sub-block to equal the page size, method 200 forces the SSD to use an entire page to store the padded sub-block.

Method 200 also includes, at 260, generating a padded portion of an ECC associated with the data sub-block. Similar to block 250, block 260 pads the portion of the ECC so that the padded portion of the ECC equals the size of the SSD page. Thus, if the portion of the ECC was 4 k bytes, and the page size was 8 k, method 200 controls the computer to pad the portion of the ECC with 4 k bytes of redundant data. By padding the portion of the ECC to equal the page size, method 200 controls the computer to force the SSD to use an entire page to store the padded portion of the ECC.

Method 200 also includes, at 270 controlling the cloud storage system to store the padded data sub-block in a page of the SSD. At 280, method 200 further controls the cloud storage system to store the padded portion of the ECC in a different page of the SSD than the padded data sub-block. By controlling the SSD to store the padded data sub-block and padded portion of the ECC in different pages, method 200 improves on conventional systems by reducing the chance that the failure of any one page in the SSD would result in data loss. For example, since SSDs only support page level reads, if the 3 k bytes of data set and 4 k bytes of ECC were stored together in one page, the failure of any part of the page would render the stored data or stored ECC useless. The time and computing resources used to compute and store the ECC would have been wasted. Storing the padded portion of the ECC and the padded data sub-block in different pages mitigates this risk. In one embodiment, method 200 may, based on the electronic forensic data and data set attributes, control the cloud storage system to store the padded portion of the ECC and the padded data sub-block in locations selected optimally for the particular SSD. For example, based on a high sub-block access frequency and wear levelling data, method 200 may control the SSD to store the padded portion of the ECC and the padded data sub-block in pages with relatively low numbers of previous reads and writes. In another example, if the forensic data indicated that a first SSD page had high rates of program disturb, method 200 may control the SSD to store the padded sub-block in the first page while storing the padded portion of the ECC in a different page that is not physically adjacent to the first page. Other embodiments may base the ECC approach and storage decisions on other combinations of electronic forensic data and data set attributes.

Figure three illustrates an example method 300 associated with dynamically selecting an ECC approach for a SSD. Method 300, at 310, includes accessing electronic forensic data about a cloud data storage system, where the cloud data storage system comprises a SSD. At 320, method 300 identifies an attribute associated with a data set to be stored by the cloud data storage system. At 330, method 300 comprises setting an importance level associated with the data set. In one embodiment, the importance level is defined by a user. In another embodiment, the importance level is set as function of the attribute. For example, a user, which may be an application employing method 300, may define a data set as being of high importance. The user may define a different, non-mission-critical data set as having a lower importance. In another example, method 300 may define the importance level based on an attribute of the data set. For instance, a first sub-block accessing entity identity may be associated with a high importance level, while a second sub-block accessing entity identity may be associated with a low importance level.

Method 300, at 340, determines if the importance level assigned at 330 meets a threshold importance level. The threshold importance level may be defined by a user. Upon determining that the importance level meets the threshold importance level, method 300, at 350, controls the computer to establish the ECC approach as a hybrid rateless Reed-Solomon ECC approach. Alternately, upon determining that the importance level does not meet the threshold importance level, method 300, at 360, controls the computer to establish the ECC approach as a fountain code ECC approach. In other embodiments, method 300 may control the computer to use other ECC approaches. By establishing the ECC approach based, at least in part, on the importance level of the data set, method 300 improves on conventional methods by, in certain situations, quickly selecting an appropriate ECC approach. In some situations, the flexibility and storage savings of the hybrid rateless Reed-Solomon ECC approach may be optimal, while in other situations, the efficient repair process of the fountain code approach may be preferable. Allowing the user to define when the different approaches are used improves the efficiency of the system relative to conventional systems.

Method 300, at 370, generates the one or more ECC associated with the data set. Method 300, at 380, controls the cloud storage system to store a portion of the data set and a portion of the one or more ECC, where the portion of the data set or the portion of the ECC are stored based, at least in part, on the selected ECC approach.

In some embodiments of method 100, method 200, or method 300, the cloud storage system may include an SSD. In other embodiments, the cloud storage system may include a shingled magnetic recording (SMR) storage device. Electronic forensic data about the SMR may be generated, accessed, and maintained similarly to how the electronic forensic data about the SSD is generated, maintained, and accessed. ECC approaches may be selected based, at least in part, on the electronic forensic data about the SMR. In further embodiments, other storage technologies may be employed. In yet another embodiment, the SSD or SMR is located locally with the computer executing method 100, method 200, or method 300. In still another embodiment, multiple SSD and SMR data stores may be employed, located both locally and in the cloud.

Figure 4:
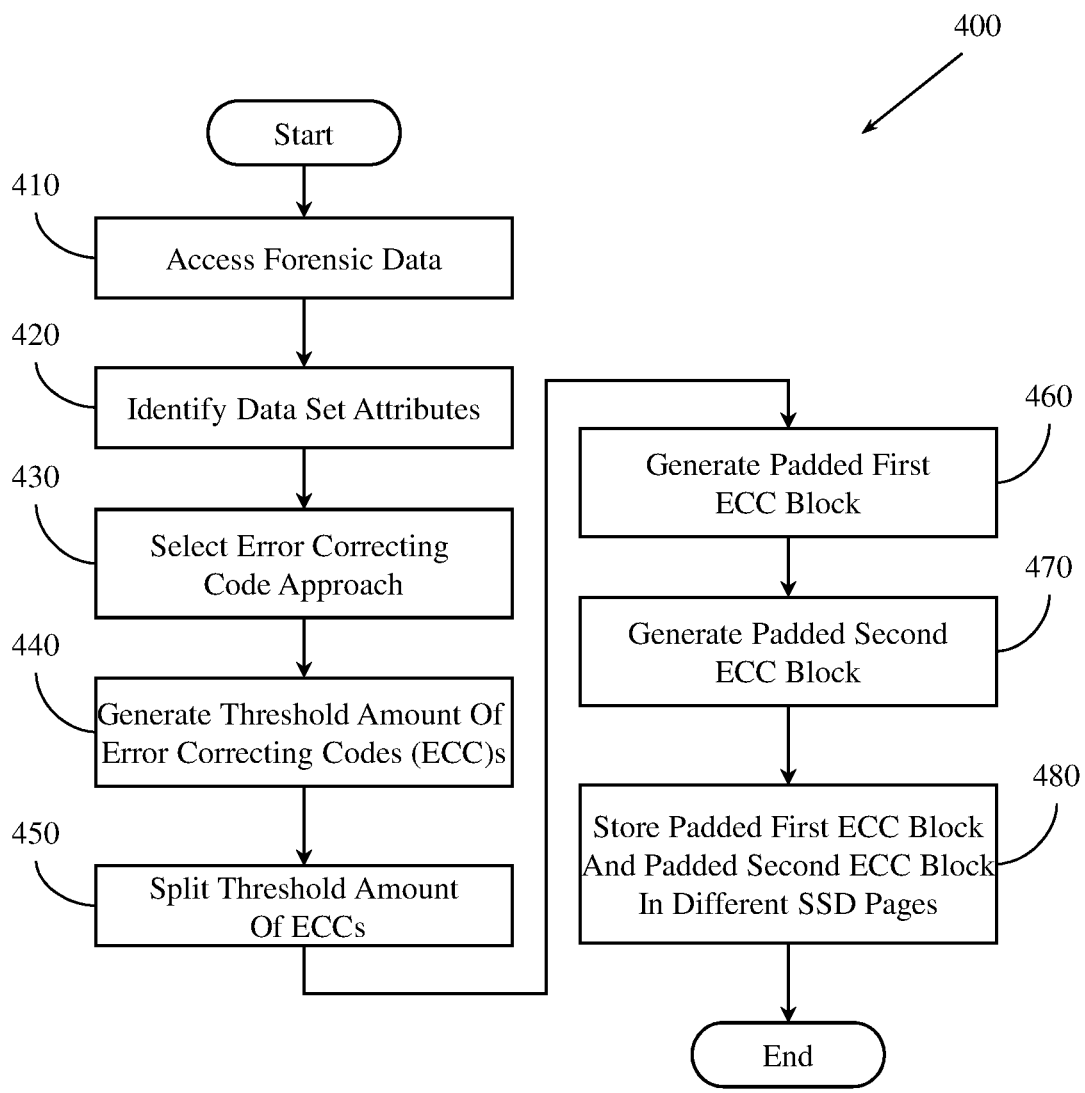
FIG. 4 illustrates an example method associated with dynamically selecting an ECC approach for a SSD.

FIG. 4 illustrates an example method 400 associated with dynamically selecting an ECC approach for a solid state device. Method 400 controls a computer to compute and store ECCs in an SSD. At 410, method 400 controls the computer to access electronic forensic data about the SSD. The electronic forensic data may include a return rate data, a random access time data, a read latency time data, a data transfer rate data, a read performance data, a wear levelling data, an access frequency data, a firmware bug data, a program disturb data, a page size data, or a flash memory type data. Other data about the SSD may be included in the forensic data. At 420, method 400 controls the computer to identify an attribute associated with a data set to be stored by the SSD. The data set may include sub-blocks. In one embodiment, the data set attribute is related to an order in which the sub-blocks are accessed, a sub-block reference count, a sub-block access frequency, a sub-block access group relationship, a sub-block accessing entity identity, a sub-block importance, or an indexing parameter.

Method 400 includes, at 430, selecting an error correcting code approach based, at least in part, on the electronic forensic data and the attribute. For example, if the electronic forensic data indicated that the SSD had poor return rate data (e.g., the SSD returns relatively many errors) but the attribute indicated that the data set sub-blocks are related to a non-mission critical group, then method 400 may select an ECC approach that prioritizes speed over redundancy.

Method 400 includes, at 440, generating a threshold amount of ECCs associated with the data set based, at least in part, on the ECC approach. For example, if a first ECC approach was selected, one set of fountain code ECCs may be generated for the data set. If a second ECC approach was selected, hybrid rateless Reed-Solomon codes may be generated. The threshold amount may be based on properties of the SSD, including page size, block size, SSD memory size, and the electronic forensic data. The threshold amount may also be a function of the attribute, or a function of both the attribute and the forensic data. The threshold amount may also be user-defined. In one example, the threshold amount may be the size of the SSD page. In another example, the threshold amount may be a multiple of the SSD page size, or a fraction of the SSD page size. In another embodiment, the threshold amount is related to the desired level of redundancy. In other examples, other threshold amounts may be used.

Method 400 includes, at 450, splitting the threshold amount of ECCs into a first ECC block and a second ECC block. In one embodiment, the first ECC block and second ECC block may be the same size. In another embodiment, the first ECC block and the second ECC block may be different sizes. Any combination of sizes may be employed.

Method 400 includes, at 460, generating a padded first ECC block. The padded first ECC block is generated by padding the first ECC block with redundant data. Method 400, at 470, generates a padded second ECC block by padding the second ECC block with redundant data. In one embodiment the padded first ECC block equals the SSD page size, and the padded second ECC block also equals the SSD page size.

Method 400, at 480, controls the SSD to store the padded first ECC block in a first page of the SSD. Method 400, at 480, also controls the SSD to store the padded second ECC block in a second, different page of the SSD. The SSD may be controlled to select pages in which to store the first padded ECC block and the second padded ECC block as a function of the ECC approach, as a function of the attribute, as a function of the electronic forensic data, or as a function of a combination of the ECC approach, the attribute, and the electronic forensic data. By storing the padded first ECC block and the padded second ECC block in separate pages, method 400 improves on conventional methods by reducing the risk of data loss. By storing the ECC blocks in separate pages, failure of any one page will not result in all the data being lost. Furthermore, pages may be selected based on the forensic data and the attribute. For example, if the attribute indicates high read frequency, method 400 may consider wear levelling patterns when determining which page to store to. Other forensic data may similarly influence method 400's decision about which pages are stored to.

Figure 5:
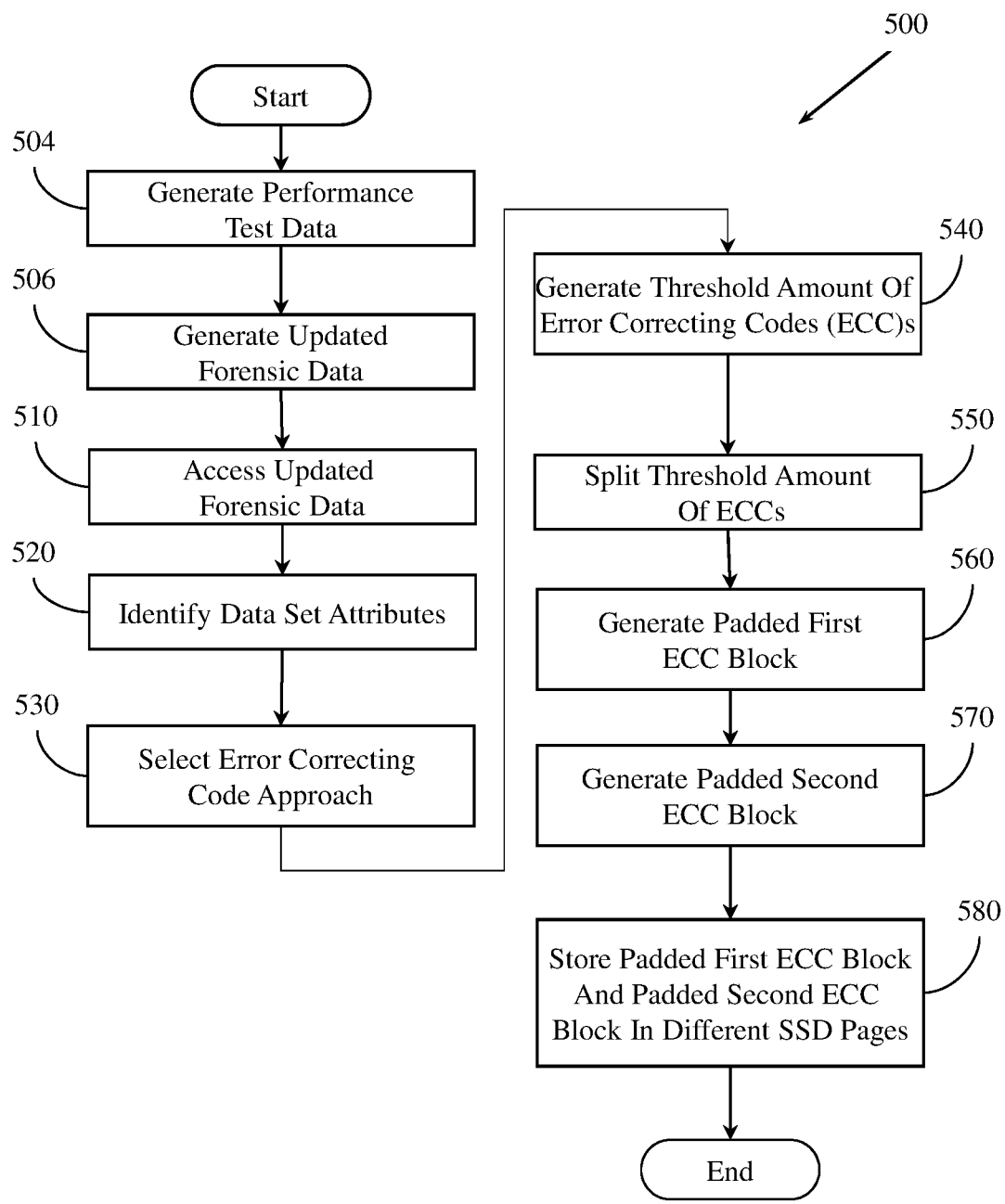
FIG. 5 illustrates an example method associated with dynamically selecting an ECC approach for a SSD.

FIG. 5 illustrates an example method 500 associated with dynamically selecting an ECC approach for a solid state device similar to method 400. Method 500 is additionally associated with generating performance test data and updated forensic data while dynamically selecting an ECC approach for a SSD.

Method 500 includes, at 504, generating performance test data by testing the performance of the SSD. SSDs may fail in different ways. SSDs may fail in regards to data retention, read disturb, program disturb, endurance, and other operating parameters. Because SSD pages may only be written to a finite number of times before they fail, SSD controllers monitor the number of writes and conduct wear levelling to prolong the life of the SSD by spreading writes around to different sectors of the SSD. Memory locations in the SSD may "leak" to nearby cells, effectively flipping an adjacent 0 bit to a 1 bit if the problem is not corrected, or if the block is not erased and re-written in time. By monitoring the performance of the SSD, method 500 can detect if the SSD is slowing down, if it is throwing increasing numbers of a particular type of error, or if its reliability is otherwise changing. SSD performance may be tested by controlling the SSD to perform a task and measuring the performance. For example, an SSD may be tested by controlling it to write test data. The time to perform the task may be monitored over time, and the ECC approach may be adjusted accordingly. Similarly, return rates and other forensic data points may be tested and monitored over time. Since SSD page reads and writes take on the order of microseconds to complete and block erases milliseconds, performance testing may occur on the fly in parallel with other operations. As knowledge about the operating parameters of the SSD is gained through the performance testing, method 500 may control the computer to adjust the performance tests themselves to the particular forensic properties of the SSD. In one embodiment, at least a return rate data, a random access time data, a read latency time data, a data transfer rate data, a read performance data, a wear levelling data, an access frequency data, a firmware bug data, or a program disturb data are monitored and tested. Other properties of the SSD may be performance tested and used to generated updated forensic data. In one embodiment, method 500 may gather performance data from the writing and reading of the data set originally tasked for storage, in addition to test-specific data.

Method 500, at 506, generates updated electronic forensic data as a function of the performance test data. The updated electronic forensic data is accessed at 510. The electronic forensic data, performance test data, or updated electronic forensic data may be stored on a computer separate from the cloud-based storage system. At 520, method 500 identifies an attribute associated with a data set to be stored by the SSD. The data set may be a non-empty set of sub-blocks. The attribute may be related to an order in which the sub-blocks are accessed, a sub-block reference count, a sub-block access frequency, a sub-block access group relationship, a sub-block accessing entity identity, a sub-block importance, or an indexing parameter.

Method 500, at 530, selects an ECC approach based, at least in part, on the updated electronic forensic data or the attribute. In one embodiment, the ECC approach is a fountain code approach or a hybrid rateless Reed-Solomon approach. In another embodiment, other ECC approaches may be employed.

At 540, method 500 generates a threshold amount of ECCs associated with the data set. The threshold amount of ECCs is based, at least in part, on the ECC approach. For example, if a first ECC approach called for high levels of redundancy, relatively more ECCs may be generated. If a second ECC approach called for low levels of redundancy, then relatively fewer ECCs may be generated. The threshold amount may also be based on properties of the SSD, including page size and block size.

Method 500, at 550, splits the threshold amount of ECCs into a first ECC block and a second ECC block. The first ECC block and the second ECC block may be the same size or may be different sizes. At 560, method 500 generates a padded first ECC block by padding the first ECC block with redundant data. The padded first ECC block may be the same size as an SSD page. At 570, method 500 generates a padded second ECC block by padding the second ECC block with redundant data. The padded second ECC block may also be the same size as a page of the SSD. In different embodiments, different sized padded ECC blocks may be generated.

Method 500, at 580, controls the SSD to store the padded first ECC block to a first page of the SSD. Method 500, also at 580, controls the SSD to store the padded second ECC block to a second, different page of the SSD. The pages to which the SSD stores the padded ECC blocks may be determined as a function of the updated forensic data, of the attribute, of the ECC approach, or as a function of a combination of the updated forensic data, the attribute, and the ECC approach. Method 500 improves on conventional methods because generating performance test data about the SSD allows further refinement of the selected ECC approach that conventional fixed ECC methods do not allow. Performance testing may be conducted per data set, per sub-block group, per SSD page, per SSD block, or on any other parameter of the data set or SSD. If method 500 detects performance degradation or changes of the SSD while storing a data set, the ECC approach may be dynamically adjusted in real-time, thereby improving reliability and efficiency over conventional fixed ECC approach systems.

Figure 6:
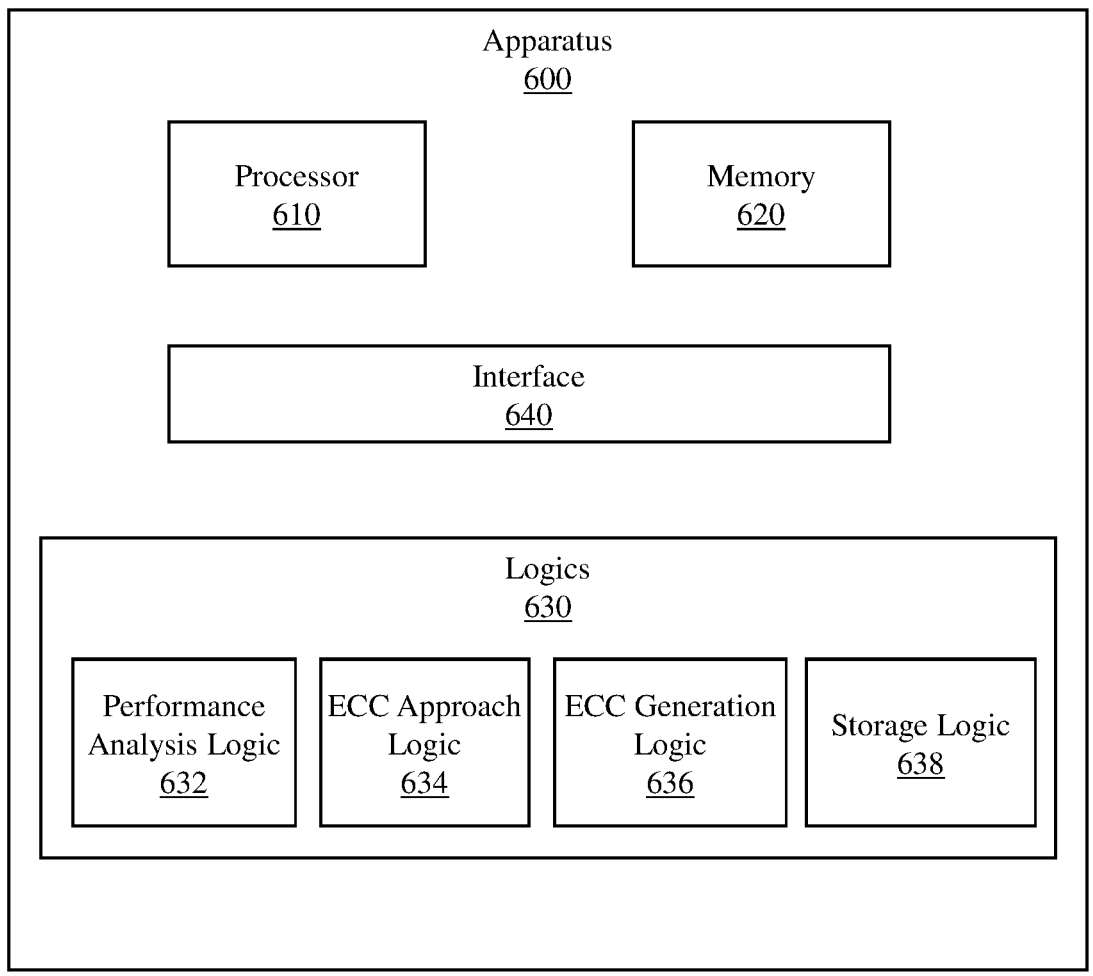
FIG. 6 illustrates an example apparatus associated with a dynamically variable ECC system.

FIG. 6 illustrates an example error correction code (ECC) apparatus 600 associated with a dynamically variable ECC system that stores data and ECCs to a solid state device. Apparatus 600 includes a processor 610, a memory 620, and a set 630 of logics that is connected to the processor 610 and memory 620 by an interface 640. In one embodiment, the apparatus 600 may be a stand-alone device connected to a data communication network. In another embodiment, apparatus 600 may be integrated into another device (e.g., deduplication apparatus) or system (e.g., object storage system). Apparatus 600 may be associated with a dynamically variable ECC system that uses hybrid rateless Reed-Solomon ECCs. By making the ECC system dynamically variable, processor 610 may run more efficiently because less ECC may need to be created. Similarly, less memory 620 may be consumed because less ECC is produced. Thus, the dynamically variable ECC system provides one approach for producing the concrete, tangible, real-world, non-abstract result of improving efficiency in an apparatus 600 that produces ECC for data sets to be stored in an SSD.

Memory 620 stores electronic forensic data about the SSD, attributes about the data set to be stored, performance test data about the SSD, and updated electronic forensic data about the SSD. Memory 620 may also store a modified Reed-Solomon matrix having row-centric error detection codes and column-centric error correcting codes. The modified Reed-Solomon matrix may take a form similar to that described in U.S. Pat. No. 7,076,723 by the same inventor, which is incorporated herein by reference.

The set of logics 630 may include a performance analysis logic 632 that analyzes performance data concerning a solid state device to which a data set is to be stored by the ECC apparatus. Performance analysis logic 632 may conduct performance tests on the SSD and may collect performance test data from the performance tests and store it to memory 620. Performance analysis logic 632 may also update electronic forensic data about the SSD. Performance analysis logic 632 may perform performance tests on the SSD in parallel with read, write, and erase operations, interleaved with read, write and erase operations, or independently of read, write, and erase operations. In one embodiment, the SSD is a NAND flash memory cloud storage device.

The set of logics 630 may also include an ECC approach logic 634. ECC approach logic 634 dynamically and selectively controls an ECC approach performed by the ECC apparatus 600. Dynamically and selectively controlling the ECC approach may be based, at least in part, on the performance data or a property of the data set. In one embodiment, a fountain code ECC approach may be selected based on the original forensic data. As a data set is stored to the SSD, performance tests may be performed by performance analysis logic 632. If performance analysis logic 632 detects a change (e.g., a degradation or an improvement) in the performance of the SSD, the ECC approach may be changed to a different approach. For example, the fountain code approach may be swapped for a hybrid rateless Reed-Solomon ECC approach. In another embodiment, the ECC approach may be dynamically and selectively modified based on the performance test data. In other embodiments, other ECC approaches may be used.

The set of logics 630 also includes an ECC generation logic 636. ECC generation logic 636 dynamically generates a non-empty set of ECC based, at least in part, on the ECC approach and the data set. In one embodiment, ECC generation logic 636 may generate fountain code ECCs if the ECC approach logic 634 selected a fountain code ECC approach. Alternately, if the ECC approach logic 634 selected a hybrid rateless Reed-Solomon approach, ECC generation logic will generate hybrid rateless Reed-Solomon ECCs. In other embodiments, other types of ECCs may be generated.

The set of logics 630 also includes storage logic 638. Storage logic 638 selectively distributes a portion of the data set and a portion of the set of ECC to the SSD. Selectively distributing a portion of the data set and a portion of the set of ECC is based, at least in part, on the performance data or the property of the data set. The data set may be a sub-block. The sub-block may have an attribute related to an order in which the sub-block is accessed, a sub-block reference count, a sub-block access frequency, a sub-block access group relationship, a sub-block accessing entity identity, a sub-block importance, or an indexing parameter. For example, if the performance data indicates that a particular page in the SSD is nearing the limit of its read/write lifetime, storage logic 638 may distribute data that has a relatively low sub-block access frequency to that page. If the performance data indicates that certain pages are demonstrating higher than acceptable return rates, storage logic 638 may avoid storing data to those pages at all. In another example, if the performance data indicates that sectors of one page were contributing to read disturbs or program disturbs in neighboring pages, storage logic 638 may decide to not distribute a portion of the data set and that portion's corresponding portion of the set of ECC to those affected pages. By selectively distributing a portion of the data set and a portion of the associated set of ECC to the SSD, apparatus 600 improves on conventional storage apparatus that may blindly distribute data and ECCs to pages in a SSD. Storage logic 638 tangibly improves the performance of processor 610 by avoiding storing to problem areas of the SSD, thereby reducing the need to repair damaged data.

In one embodiment, storage logic 638 selectively distributes a portion of the data set to a first page of the SSD. In this embodiment, storage logic 638 also selectively distributes a portion of the set of ECC to a second, different page of the SSD. By selectively distributing a portion of the data set to a first page and a portion of the set of ECC to a second, different page, storage logic 638 mitigates the danger of losing both the portion of the set of ECC and the portion of the data set due to the failure of one page of the SSD. By selectively distributing a portion of the data set to a first page and a portion of the set of ECC to a different pages that are physically separated from each other within the SSD, storage logic 638 also reduces the chance of program disturbs or read disturbs corrupting both the ECC and the data. Storage logic 638 thus further improves on conventional solid state device ECC methods and apparatus.

In one embodiment of apparatus 600, storage logic 638 generates a set of collected ECC by collecting members of the set of ECC in the memory 620 until a threshold amount of ECCs are collected. The threshold amount may be based, at least in part, on the performance data or on the operating parameters of the SSD. The threshold amount may be set by a user. Storage logic 638 then splits the collected ECC into a first sub-portion and a second sub-portion. In one embodiment, the sub-portions are of equal size. In another embodiment, the sub-portions are of different sizes. In both embodiments, the sub-portions are smaller than the page size of the SSD. Storage logic 638 then generates a padded first sub-portion and a padded second-sub portion. The padded first sub-portion and padded second sub-portion are generated by appending, prepending, or interleaving redundant data with the first sub-portion and second sub-portion. In one embodiment, the padded first sub-portion is the same size as a page of the SSD and the padded second sub-portion is also the same size as a page of the SSD. Storage logic 638 then selectively distributes, based, at least in part, on the performance data or a property of the data set, a portion of the data set, the padded first sub-portion, or the padded second sub-portion to different pages of the SSD. By making the padded sub-portions the same size as a page of the SSD, storage logic 638 forces the SSD to store the different padded sub-portions in different pages, thereby reducing the risk that all the data will be lost due a failure of one SSD page. Distributing and storing the portion of the data set and the padded sub-portions to different pages or even different blocks further enables performance analysis logic 632 to gather performance test information about those particular pages or blocks that in a conventional apparatus may go unused.

Figure 7:
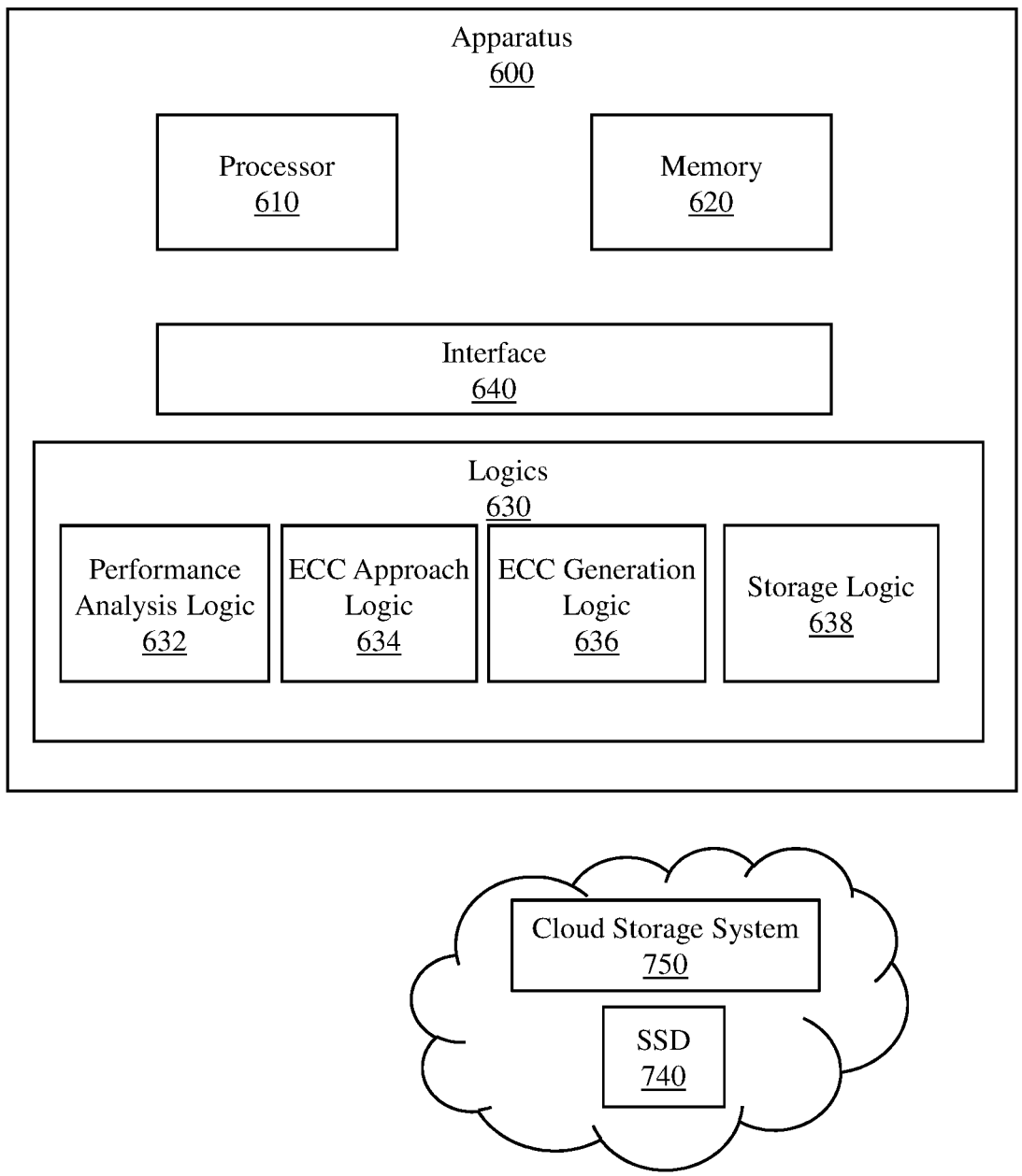
FIG. 7 illustrates an example apparatus associated with a dynamically variable ECC system.

FIG. 7 illustrates another embodiment of apparatus 600. In FIG. 7, a cloud storage system 750 includes an SSD 740. Cloud storage system 750 and SSD 740 are located remotely from apparatus 600. Performance test data, electronic forensic data, and attributes about the data set are stored locally in memory 620. Thus the performance test data, electronic forensic data, and attributes about the data set are not dependent on the reliability of SSD 740, or on the connection to the cloud storage system 750.

Figure 8:
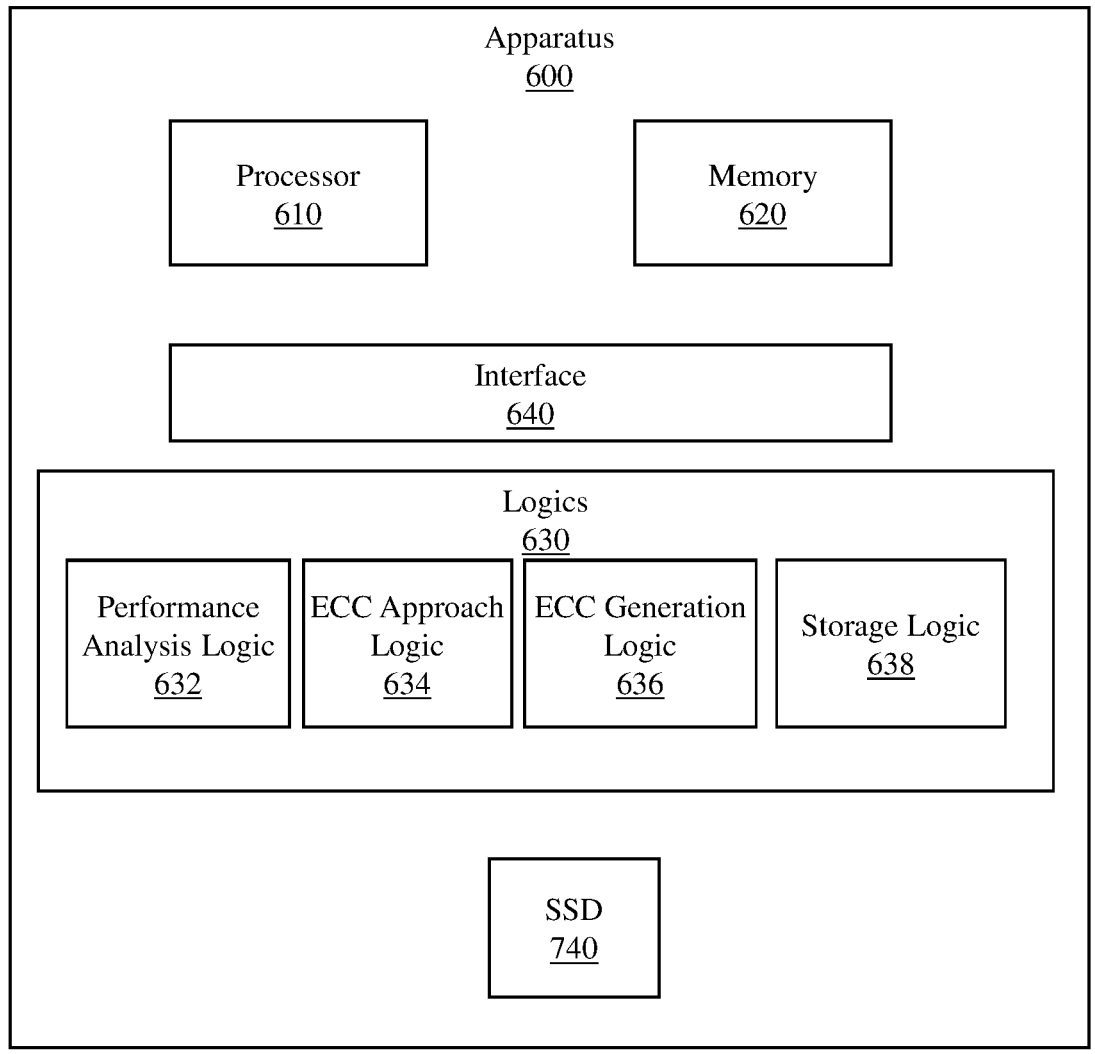
FIG. 8 illustrates an example apparatus associated with a dynamically variable ECC system.

FIG. 8 illustrates another embodiment of apparatus 600. In FIG. 8, SSD 740 is situated locally to apparatus 600. In one embodiment, apparatus 600 and SSD 740 may be part of a data storage server, a desktop computer, a laptop computer, a tablet computer, a smart phone, or other system that stores data and ECCs to a local SSD. In one embodiment, the SSD 740 may be a removable flash drive or other removable SSD. Apparatus 600 thus improves on conventional data storage systems that store to SSDs by enabling performance testing and analysis of different SSDs 740 that may be used in conjunction with apparatus 600. For example, the performance of processor 610 and memory 620 may be enhanced by tailoring the ECC approach to different, unique SSDs that a particular laptop computer may encounter. In another embodiment, SSD 740 may include a shingled magnetic recording (SMR) storage device.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable medium storing computer executable instructions that when executed by a computer control the computer to perform a method, the method comprising:
   accessing, from a local memory of the computer, electronic forensic data about a cloud data storage system that is remote to the computer;
   identifying, from the local memory, an attribute associated with a data set to be stored by the cloud data storage system;
   selecting an error correcting code (ECC) method based, at least in part, on an analysis performed by the computer of the electronic forensic data, and the attribute;
   generating one or more ECC associated with the data set based, at least in part, on the ECC method;
   controlling the cloud data storage system to store a portion of the data set; and
   storing a portion of the one or more ECC to the local memory,
   where the portion of the data set or the portion of the ECC are selected based, at least in part, on the ECC method.

2. The non-transitory computer-readable medium of claim 1, where the cloud data storage system comprises a solid state device (SSD).

3. The non-transitory computer-readable medium of claim 2, where the SSD is a NAND flash memory device.

4. The non-transitory computer-readable medium of claim 1, where the electronic forensic data includes a return rate data, a random access time data, a read latency time data, a data transfer rate data, a read performance data, a wear levelling data, an access frequency data, a firmware bug data, a program disturb data, a page size data, or a flash memory type data.

5. The non-transitory computer-readable medium of claim 4, where the one or more ECC are fountain codes or hybrid rateless Reed-Solomon codes.

6. The non-transitory computer-readable medium of claim 1, where the data set comprises sub-blocks, and where the attribute comprises one of a group consisting of an order in which the sub-blocks are accessed, a sub-block reference count, a sub-block access frequency, a sub-block access group relationship, a sub-block accessing entity identity, a sub-block importance, and an indexing parameter.

7. The non-transitory computer-readable medium of claim 1, where controlling the cloud data storage system to store a portion of the data set comprises:
generating a padded data sub-block of the portion of the data set, where the padded sub-block is the same size as a page size of a cloud SSD in the cloud data storage system;
generating a padded portion of an ECC associated with the data sub-block, where the padded portion of the ECC is the same size as a page size of the cloud SSD;
controlling the cloud storage system to store the padded data sub-block in a page of the cloud SSD; and
controlling the cloud storage system to store the padded portion of the ECC in a different page of the cloud SSD.

8. The non-transitory computer-readable medium of claim 6, the method comprising setting an importance level associated with the data set, where the importance level is defined by a user, or is set as function of the attribute.

9. The non-transitory computer-readable medium of claim 8, the method comprising:
upon determining that the importance level meets a threshold importance level, establishing the ECC method as a hybrid rateless Reed-Solomon ECC method, where the threshold importance level is defined by a user; and
upon determining that the importance level does not meet the threshold importance level, establishing the ECC method as a fountain code ECC method.

10. The non-transitory computer-readable medium of claim 1, where the cloud data storage system comprises a shingled magnetic recording (SMR) storage device.

11. A non-transitory computer-readable medium storing computer executable instructions that when executed by a computer control the computer to perform a method for computing and storing error correction codes (ECCs) in a local solid state device (SSD), the method comprising:
accessing electronic forensic data about a cloud SSD in a cloud data storage system that is remote to the computer;
identifying an attribute associated with a data set to be stored by the cloud SSD;
selecting an error correcting code (ECC) method based, at least in part, on the electronic forensic data and the attribute;
generating a threshold amount of ECCs associated with the data set based, at least in part, on the ECC method;
splitting the threshold amount of ECCs into a first ECC block and a second ECC block;
generating a padded first ECC block by padding the first ECC block with redundant data;
generating a padded second ECC block by padding the second ECC block with redundant data, and
controlling the local SSD to store the padded first ECC block in a first page of the local SSD, and to store the padded second ECC block in a second, different page of the local SSD.

12. The non-transitory computer readable medium of claim 11, the method comprising:
generating performance test data by testing the performance of the cloud SSD;
generating updated electronic forensic data as a function of the performance test data; and
selecting the ECC method based, at least in part, on the updated electronic forensic data or the attribute.

13. The non-transitory computer-readable medium of claim 12, where the electronic forensic data, performance test data, or updated electronic forensic data are stored on a local memory of the computer.

14. The non-transitory computer-readable medium of claim 11, where the ECC method is a fountain code method or a hybrid rateless Reed-Solomon method.

15. An error correction code (ECC) apparatus, comprising:
a processor;
a memory;
a set of logics; and
an interface that connects the processor, the memory, and the set of logics;
the set of logics comprising:
a performance analysis logic that analyzes performance data concerning a cloud solid state device (SSD) in a cloud data storage system that is remote to the ECC apparatus to which a data set is to be stored by the ECC apparatus;
an ECC method logic that dynamically and selectively controls an ECC method performed by the ECC apparatus based, at least in part, on the performance data or a property of the data set;
an ECC generation logic that dynamically generates a non-empty set of ECC based, at least in part, on the ECC method and the data set, and
a storage logic that selectively distributes a portion of the data set to the cloud SSD and a portion of the set of ECC to a local SSD included in the memory, based, at least in part, on the performance data or the property of the data set.

16. The apparatus of claim 15, where the performance data includes a return rate data, a random access time data, a read latency time data, a data transfer rate data, a read performance data, a wear levelling data, an access frequency data, a firmware bug data, a program disturb data, a page size data, an SSD architecture data, or a flash memory type data.

17. The apparatus of claim 16, where the cloud SSD is a NAND flash memory cloud storage device.

18. The apparatus of claim 17, where the storage logic:
selectively distributes a portion of the data set to a first page of the cloud SSD, and
selectively distributes a portion of the set of ECC to a second, different page of the cloud SSD.

19. The apparatus of claim 15, where the ECC method is a fountain code method or a hybrid rateless Reed-Solomon method.

20. The apparatus of claim 19, where the storage logic:
generates a set of collected ECC by collecting members of the set of ECC in the local SSD until a threshold amount of ECCs are collected, where the threshold amount is based, at least in part, on the performance data;

splits the set of collected ECC into a first sub-portion and a second sub-portion;

generates a padded first sub-portion and a padded second sub-portion by appending, prepending, or interleaving redundant data with the first sub-portion and the second sub-portion, where the padded first sub-portion is the same size as a page of the SSD, and where the padded second sub-portion is the same size as a page of the cloud SSD, and selectively distributes, based, at least in part, on the performance data or a property of the data set, a portion of the data set, the padded first sub-portion, or the padded second sub-portion to different pages of the cloud SSD.

* * * * *